(12) United States Patent
Zheng et al.

(10) Patent No.: US 11,631,811 B2
(45) Date of Patent: Apr. 18, 2023

(54) WSIGE ELECTRODE STRUCTURES FOR MEMORY DEVICES, AND ASSOCIATED DEVICES AND SYSTEMS

(71) Applicant: Micron Technology, Inc., Boise, ID (US)

(72) Inventors: Pengyuan Zheng, Boise, ID (US); Yongjun J. Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/315,114

(22) Filed: May 7, 2021

(65) Prior Publication Data

US 2022/0359822 A1    Nov. 10, 2022

(51) Int. Cl.
*H01L 45/00* (2006.01)

(52) U.S. Cl.
CPC ............ *H01L 45/126* (2013.01); *H01L 45/06* (2013.01)

(58) Field of Classification Search
CPC .............................. H01L 45/126; H01L 45/06
See application file for complete search history.

(56) References Cited

U.S. PATENT DOCUMENTS

| 2009/0185412 A1 | 7/2009 | Peng et al. |
| 2011/0049459 A1 | 3/2011 | Ahn et al. |
| 2011/0062557 A1* | 3/2011 | Bandyopadhyay ... H01L 29/165 257/E21.352 |
| 2011/0076786 A1* | 3/2011 | Ahmad .................. H05B 6/806 392/416 |
| 2017/0125509 A1* | 5/2017 | Ferrer Luppi .......... H01L 28/24 |
| 2019/0252609 A1* | 8/2019 | Sei ......... H01L 27/224 |
| 2021/0050512 A1* | 2/2021 | Fugazza ................. H01L 45/16 |
| 2021/0249600 A1* | 8/2021 | Chien ................ H01L 27/2427 |
| 2021/0305318 A1* | 9/2021 | Gealy ................ H01L 27/2427 |
| 2022/0199646 A1* | 6/2022 | Hopkins .......... H01L 27/11582 |

FOREIGN PATENT DOCUMENTS

TW          200933883 A       8/2009

OTHER PUBLICATIONS

TW Patent Application No. 111110039—Taiwanese Office Action and Search Report, dated Nov. 15, 2022, with English Translation, 12 pages.

* cited by examiner

*Primary Examiner* — Jerome Leboeuf
(74) *Attorney, Agent, or Firm* — Perkins Coie LLP (57) ABSTRACT

Memory devices having electrode structures that increase in resistivity with thermal cycling, and associated systems and methods, are disclosed herein. In some embodiments, a memory device includes a memory element and an electrode structure electrically coupled to the memory element. The electrode structure can include a material comprising a composition of tungsten, silicon, and germanium.

22 Claims, 5 Drawing Sheets

WSIGE ELECTRODE STRUCTURES FOR MEMORY DEVICES, AND ASSOCIATED DEVICES AND SYSTEMS

TECHNICAL FIELD

The present technology generally relates to memory devices, and more particularly relates to memory devices having electrode structures that increase in resistivity with thermal cycling.

BACKGROUND

Memory devices are widely used to store information related to various electronic devices such as computers, wireless communication devices, cameras, digital displays, and the like. Information is stored by programing different states of a memory cell. Various types of memory devices exist, such as non-volatile memory devices (e.g., NAND Flash memory devices) and volatile memory devices (e.g., dynamic RAM (DRAM), synchronous dynamic RAM (SDRAM), and the like).

Improving memory devices, generally, can include increasing memory cell density, increasing read/write speeds or otherwise reducing operational latency, increasing reliability, increasing data retention, reducing power consumption, or reducing manufacturing costs, among other metrics. Manufacturers can reduce manufacturing costs by, for example, reducing the amount of power or material used. Manufacturers can likewise increase reliability by forming memory devices with specific materials or configurations such that they do not degrade as quickly over time.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Embodiments of the present technology are directed to memory devices having electrode structures that can increase in resistivity with thermal cycling, and associated systems and methods. In some embodiments, a memory device includes a memory element and an electrode structure electrically coupled to the memory element. The electrode structure can include a first material and a second material between the first material and the memory element. The first material can be different than the second material and, in some embodiments, the first material can comprise a composition of tungsten, silicon, and germanium (WGeSi).

In some aspects of the present technology, an initial resistivity of the electrode structure can be lower than an operating resistivity of the electrode structure after the memory device has been exposed to multiple heating cycles. For example, the electrode structure can have a relatively low resistivity initially after formation, and can increase in resistance during operation as the memory device is thermally cycled during conditioning, programming, writing, reading, and so on. The resistivity of the electrode structure is a material property that changes because of heat generated by a voltage across and a current through the electrode structure over the lifetime of the memory device. In some embodiments, the resistivity can be directly proportional to a voltage across and a current through the electrode structure over the lifetime of the memory device. Accordingly, the current (e.g., a spike current) through the electrode structure can decrease over the lifetime of the memory device in proportion to the increase in resistivity. As such, the electrode structure can have (i) a relatively low resistivity and high corresponding spike current toward the beginning of the lifetime of the memory device (e.g., during conditioning) and (ii) a relatively high resistivity and low corresponding spike current thereafter during the lifetime of the memory device and toward the end of the lifetime of the memory device (e.g., during operation). The relatively high resistivity and low corresponding spike current can change in magnitude over the lifetime of the memory device due to, for example, accumulated material effects or based on the selected (WGeSI) composition of the electrode structure.

In some aspects of the present technology, the relatively low resistivity of the electrode structure at the beginning of the lifetime of the memory device can improve the efficiency of conditioning of the memory device. For example, the reduced resistivity can reduce the amount of power that need be applied to the memory device to produce the same conditioning current spikes through the electrode structure. At the same time, the relatively high resistivity of the electrode structure during operation of the memory device can improve the endurance of the memory device. For example, the increased resistance can decrease the magnitude of current spikes through the electrode structure and/or the memory element (e.g., cell) during operation, thereby reducing degradation of the memory device. Accordingly, forming the electrode structure to include the WGeSi composition can decrease the manufacturing costs and/or improve the lifespan of the memory device by improving conditioning efficiency and/or reducing degradation of the memory device during operation.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1-8. For example, some details of memory devices well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1:
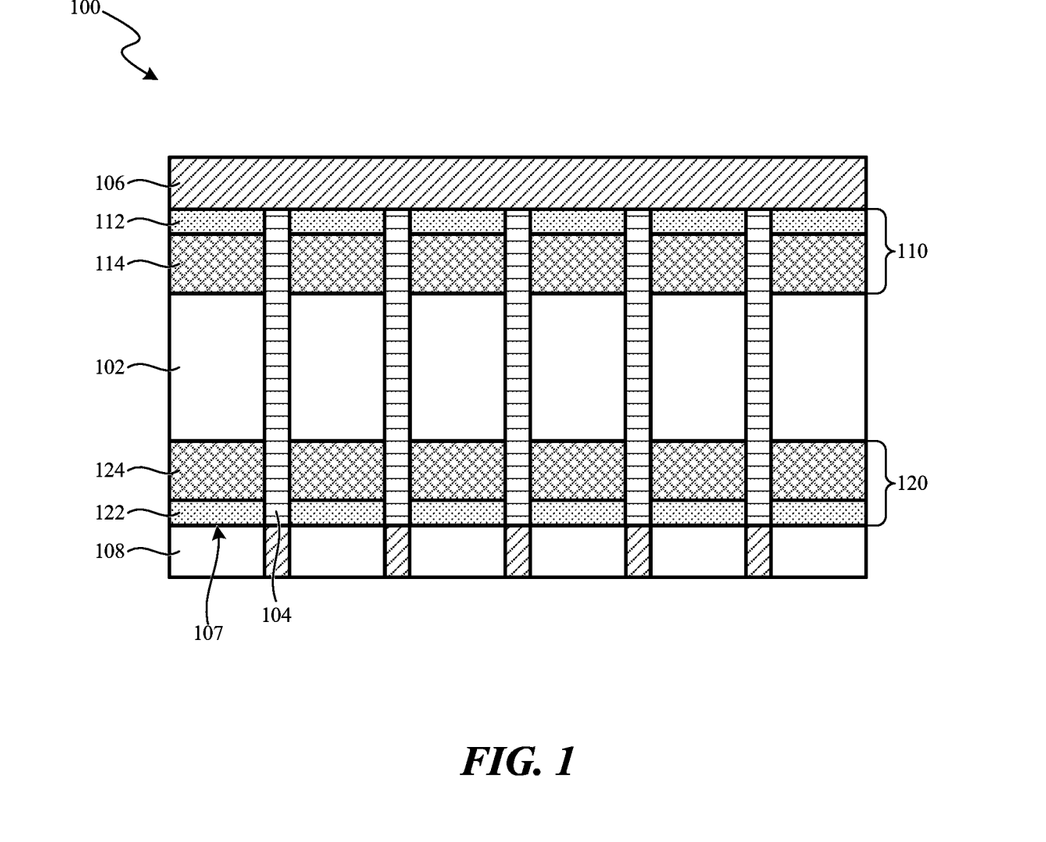
FIG. 1 is an enlarged side cross-sectional view of a portion of a memory device in accordance with embodiments of the present technology.

FIG. 1 is an enlarged side cross-sectional view of a portion of a memory device 100 in accordance with embodiments of the present technology. In the illustrated embodiment, the memory device 100 includes a plurality of memory elements 102 each electrically coupled to a corresponding first electrode structure 110 (e.g., an upper electrode structure, a top electrode structure) and a corresponding second electrode structure 120 (e.g., a lower electrode structure, a bottom electrode structure). The first electrode structure 110 can include a first material 112 (e.g., a first electrode material, a resistivity control material) and a second material 114 (e.g., a second electrode material). Similarly, the second electrode structure 120 can include a third material 122 (e.g., a third electrode material, a resistivity control material) and a fourth material 124 (e.g., a fourth electrode material). In some embodiments, the memory elements 102 and the corresponding first and second electrode structures 110, 120 can be arranged in columns 107 separated by electrically insulative columns 104.

In some embodiments, the memory device 100 further includes (i) a first metallization layer 106 extending at least partially over the first electrode structures 110 and upper portions of the insulative columns 104 and (ii) a second metallization layer 108 extending at least partially over the second electrode structures 120 and lower portions of the insulative columns 104. The first and second metallization layers 106, 108 can comprise a metal such as tungsten, a metal alloy, a conductive-metal containing material, and/or the like. In some embodiments, the first and second metallization layers 106, 108 can include metal lines extending through an insulating material in orthogonal directions. The insulative columns 104 can comprise an oxide material, a dielectric material, a nitride material, and/or the like.

In some embodiments, the memory elements 102 can include, for example, one or more chalcogenide and/or phase-change materials. In some embodiments, the memory elements 102 can each include a dedicated memory cell and a selector electrically coupled together. In other embodiments, the memory elements 102 can include self-selecting memory cells. For example, the memory elements 102 can each comprise a chalcogenide element configured as both a memory storage element and a selection element. In operation, each of the memory elements 102 can store a bit of data and can be written to (e.g., accessed) by varying (i) a voltage supplied to the corresponding one of first electrode structures 110 via the first metallization layer 106 (e.g., a word line, a bit line, and/or another suitable structure) and/or (ii) a voltage supplied to the corresponding one of the second electrode structures 120 via the second metallization layer 108 (e.g., a word line, a bit line, and/or another suitable structure). In some embodiments, the memory elements 102 are non-volatile.

The first metallization layer 106 and/or the second metallization layer 108 can be electrically coupled to conductive vias, conductive contacts, and/or other suitable structures of the memory device 100 (not shown) used to operably couple the memory device 100 to external devices (e.g., a processor device) and/or to other components (e.g., other memory devices) within an integrated memory package. As one of ordinary skill in the art will appreciate, the memory device 100 can be further "packaged" for protection and to include appropriate electrical interconnections.

In the illustrated embodiment, the first material 112 of the first electrode structure 110 is positioned over (e.g., above) the second material 114 and between the second material 114 and the first metallization layer 106. Likewise, the third material 122 of the second electrode structure 120 is positioned over (e.g., below) the fourth material 124 and between the fourth material 124 and the second metallization layer 108. In some embodiments, the second and fourth materials 114, 124 can comprise an electrically-conductive metal. In some embodiments, the second and fourth materials 114, 124 can be carbon-based materials comprising amorphous carbon, a carbide material, and/or other carbon-based materials. In some embodiments, the second and fourth materials 114, 124 can be different materials, such as different carbide materials.

The first and third materials 112, 122 can comprise the same or different materials. For example, in some embodiments the first and third materials 112, 122 can each comprise a composition (e.g., an alloy) of tungsten, germanium, and silicon (WGeSi). The first and third materials 112, 122 can be deposited (e.g., onto the second material 114 and the second metallization layer 108, respectively) via sputtering, chemical vapor deposition, physical vapor deposition, atomic layer deposition, spin coating, electroplating, electroless plating, and/or another suitable deposition technique. In some embodiments, the first and third materials 112, 122 can be deposited as a film (e.g., a thin film) having a thickness of between about 10-30 angstroms, between about 50-90 angstroms, less than 100 angstroms, between about 10-100 angstroms, between about 80-150 angstroms, between about 50-200 angstroms, or greater than about 200 angstroms. The first and third materials 112, 122 can be configured to control, define, and/or influence a resistivity (e.g., a resistivity profile) of the first and second electrode structures 110, 120, respectively. More specifically, the first and third materials 112, 122 can be configured to cause the first and second electrode structures 110, 120 to have a resistivity that is initially low but that increases as the memory device 100 is cycled (e.g., electrically cycled on/off) during its lifetime and therefore experiences thermal cycles of higher and lower temperatures.

Figure 2:
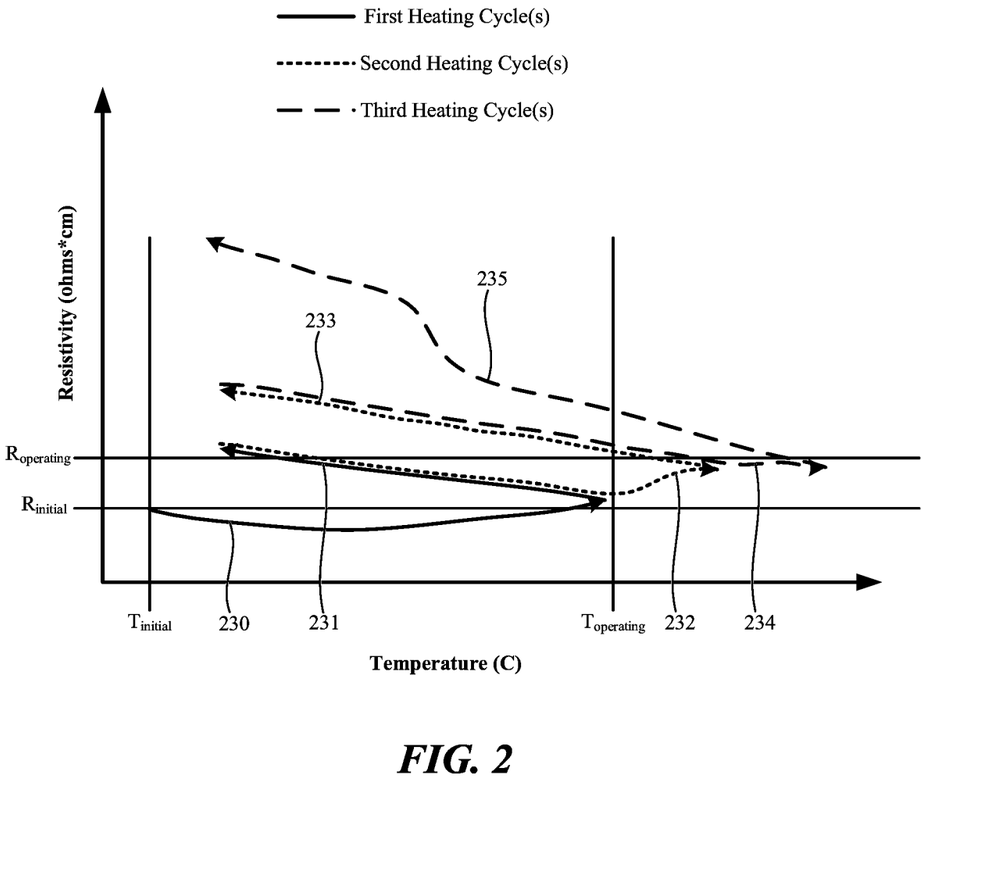
FIG. 2 is a graph illustrating the effect of temperature cycling on the resistivity of an electrode structure of the memory device of FIG. 1 in accordance with embodiments of the present technology.

FIG. 2, for example, is a graph illustrating the effect of temperature cycling on the resistivity (e.g., bulk resistivity) of one of the first electrode structures 110 including WGeSi and/or one of the second electrode structures 120 including WGeSi (collectively or individually referred to as "the electrode structure including WGeSi") in accordance with embodiments of the present technology. As shown, the electrode structure including WGeSi can have an initial resistivity $R_{initial}$ at or near an initial temperature $T_{initial}$ before temperature cycling. The initial temperature $T_{initial}$ can be a room temperature, a manufacturing temperature higher than room temperature, a manufacturing temperature at room temperature, or a manufacturing temperature lower than room temperature. The electrode structure including WGeSi can have the initial resistivity $R_{initial}$ after formation (e.g., deposition) of the electrode structure during device manufacturing. In some embodiments, the initial temperature $T_{initial}$ can be between about 20° C.-30° C. (e.g., about 25° C.). In some embodiments, the value $R_{initial}$ can be less than about 0.1 ohm-centimeter less than about 0.01 ohm-centimeter, less than about 0.008 ohm-centimeter, less than about 0.0005 ohm-centimeter, less than about 0.0003 ohm-centimeter, or less.

As shown by the line 230 in FIG. 2, when the electrode structure including WGeSi is initially heated during one or multiple first heating cycles (e.g., a single first heating cycle or an average over a plurality of first heating cycles), the resistivity of the electrode structure including WGeSi can initially decrease before increasing at or near an operating temperature $T_{operating}$ of the memory device 100. In some embodiments, the operating temperature $T_{operating}$ can be between about 400° C.-500° C. (e.g., about 450° C.) or higher. As shown by the line 231, when the electrode structure including WGeSi is initially cooled during the first heating cycle(s), the resistivity of the electrode structure including WGeSi can increase as the electrode structure returns toward the initial temperature $T_{initial}$ such that the resistivity is greater than the initial resistivity $R_{initial}$.

As shown by the line 232, when the electrode structure including WGeSi is heated again during one or multiple second heating cycles (e.g., a single second heating cycle or an average over a plurality of second heating cycles), the resistivity of the electrode structure including WGeSi can again initially decrease before increasing at or near the operating temperature $T_{operating}$ to a resistivity that is greater than or equal to the resistivity at the operating temperature $T_{operating}$ during the first heating cycle(s). As shown by the line 233, when the electrode structure including WGeSi is cooled again during the second heating cycle(s), the resistivity of the electrode structure including WGeSi can increase as the electrode structure returns toward the initial temperature $T_{initial}$ such that the resistivity is greater than the initial resistivity $R_{initial}$ and greater than or equal to the resistivity after the first heating cycle(s). As shown by the line 234, when the electrode structure including WGeSi is heated again during one or multiple third heating cycles (e.g., a single third heating cycle or an average over a plurality of third heating cycles), the resistivity of the electrode structure including WGeSi can decrease before generally leveling out at or near the operating temperature $T_{operating}$ to a resistivity that is greater than or equal to the resistivity at the operating temperature $T_{operating}$ during the second heating cycle(s). As shown by the line 235, when the electrode structure including WGeSi is cooled again during the third heating cycle(s), the resistivity of the electrode structure including WGeSi can increase as the electrode structure returns toward the initial temperature $T_{initial}$ such that the resistivity is higher than the initial resistivity $R_{initial}$ and greater than or equal to the resistivity after the second heating cycle(s).

Accordingly, in some aspects of the present technology the initial resistivity $R_{initial}$ (e.g., at or near the initial temperature $T_{initial}$) of the electrode structure including WGeSi can be lower than an operating resistivity $R_{operating}$ (e.g., at or near the operating temperature $T_{operating}$) of the electrode structure after the memory device 100 has been cycled through multiple heating cycles. That is, the resistivity of the electrode structure including WGeSi can have a relatively low resistivity after formation and can increase in resistance during operation as the memory device 100 is thermally cycled. In some embodiments, the resistivity of the electrode structure including WGeSi can converge toward the operating resistivity $R_{operating}$ after the memory device 100 has been cycled through multiple heating cycles.

Figure 3:
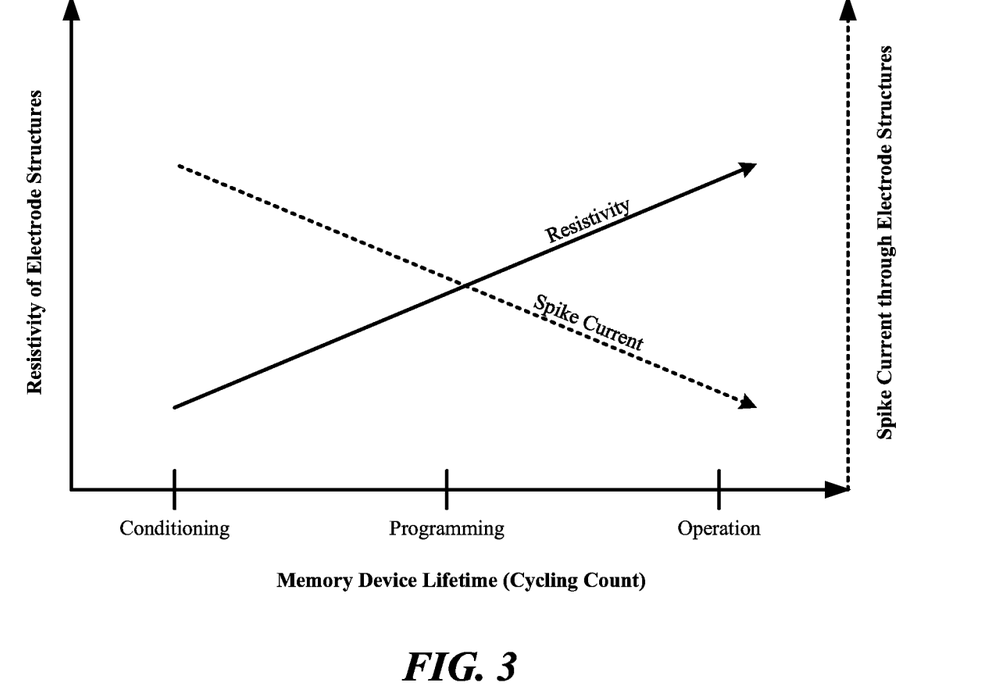
FIG. 3 is a graph schematically illustrating the resistivity of the electrode structure of FIG. 1 and a resulting spike current through the electrode structure over a lifetime of the memory device in accordance with embodiments of the present technology.

Referring again to FIG. 1, the resistivity of the first and second electrode structures 110, 120 over the lifetime of the memory device 100 is directly proportional to the heat induced/generated by a voltage across and a current through the first and second electrode structures 110, 120. FIG. 3 is a graph schematically illustrating the resistivity of the first and second electrode structures 110, 120 (including WGeSi) and a resulting spike current through the first and second electrode structures 110, 120 over a lifetime of the memory device 100 in accordance with embodiments of the present technology. As shown in FIG. 3, the memory device 100 can undergo conditioning, programming, and operation during its lifetime—each of which can include multiple thermal cycles. For example, conditioning (e.g., seasoning) of the first and second electrodes structures 110, 120 can include repeatedly powering the first and second electrodes structures 110, 120 until the memory elements 102 reach a steady state. Likewise, programming can include repeatedly powering the first and second electrodes structures 110, 120 to write data to the memory elements 102. Operation of the memory device 100 can include repeatedly powering the first and second electrodes structures 110, 120 to read the data from the memory elements 102.

As described in detail with reference to FIG. 2, the first and second electrode structures 110, 120 can increase in resistivity over the lifetime of the memory device 100 as the first and second electrode structures 110, 120 are powered and thermally cycled during conditioning, programming, and operation. Therefore, the current (e.g., spike current) through the first and second electrode structures 110, 120 (e.g., for the same applied voltage) can decrease over the lifetime of the memory device 100 in proportion to the increase in resistivity. Accordingly, as shown in FIG. 3, the first and second electrode structures 110, 120 can have (i) a relatively low resistivity and high corresponding spike current toward the beginning of the lifetime of the memory device 100 (e.g., during conditioning) and (ii) a relatively high resistivity and low corresponding spike current toward the end of the lifetime of the memory device 100 (e.g., during operation).

In some aspects of the present technology, the relatively low resistivity of the first and second electrode structures 110, 120 at the beginning of the lifetime of the memory device 100 can improve the efficiency of conditioning of the memory device 100. For example, the reduced resistivity initially reduces the amount of power that need be applied to the memory device 100 to produce the same conditioning current spikes through the first and second electrode structures 110, 120. At the same time, the relatively high resistivity of the first and second electrode structures 110, 120 during operation of the memory device 100 can improve the endurance of the memory device 100. For example, the increased resistance can decrease the magnitude of current spikes through the first and second electrode structures 110, 120 during operation (e.g., read and/or write operations), thereby reducing degradation of the memory device 100. In contrast, carbon electrodes typically have a low initial resistivity, but the resistivity irreversibly drops when heated during device cycling, thereby leading to relatively large current spikes during device operation that can reduce the lifespan of the device. Likewise, tungsten silicon nitride (WSiN)-based and carbon nitride (CN)-based electrodes typically have a generally constant resistivity when heated during device cycling—but the resistivity can be too high to efferently condition the device. Or, WSiN-based and CN-based electrodes can have a resistivity that drops when heated leading to higher spike currents and increased cell damage. Accordingly, forming the first and second electrode structures 110, 120 to include the first material 112 and the third material 122 comprising WGeSi can decrease the manufacturing costs and/or improve the lifespan of the memory device 100 by improving conditioning efficiency and/or reducing degradation of the memory device 100 during operation.

Referring to FIGS. 1 and 2 together, in some embodiments the composition of the first material 112 and/or the third material 122 can be selected to provide a specific resistivity profile for the first electrode structure 110 and/or the second electrode structure 120, respectively. In some embodiments, the resistivity profiles of the first and second electrode structures 110, 120 can be specifically selected based on the characteristics (e.g., size, composition) of the memory elements 102. More specifically, a ratio (e.g., a mass ratio, a volume ratio, a molecular ratio) of tungsten to silicon to germanium ($W_x Si_y Ge_z$) in the first and third materials 112, 122 can be varied to vary the initial resistivity $R_{initial}$, the operating resistivity $R_{operating}$, and/or another characteristic of the first and second electrode structures 110, 120. For example, in some embodiments the first and third materials 112, 122 can comprise $W_{1.0}Si_{2.4}Ge_{3.6}$, $W_{1.0}Si_{3.5}Ge_{1.2}$, $W_{1.0}Si_{4.9}Ge_{2.0}$, or the like. In some embodiments, the first and third materials 112, 122 can comprise $W_{0.2-1.0}Si_{1.0}Ge_{0.2-1.0}$. Accordingly, the first and third materials 112, 122 can comprise a composition of tungsten, silicon, and germanium in which (i) the ratio of silicon to tungsten is greater than 1.0, (ii) the ratio of germanium to tungsten is greater than 1.0, (iii) the ratio of germanium to tungsten is greater than the ratio of silicon to tungsten, (iv) the ratio of germanium to tungsten is less than the ratio of silicon to tungsten, and so on. In some embodiments, the first and third materials 112, 122 can comprise tungsten silicon germanium nitride (WSiGeN).

In some embodiments, increasing the amount of silicon in the composition can increase the operating resistivity $R_{operating}$. In some embodiments, increasing the amount of germanium in the composition can increase (i) the operating resistivity $R_{operating}$, (ii) a thermal resistance at the operating temperature $T_{operating}$, and/or (iii) a difference between the operating resistivity $R_{operating}$ and the initial resistivity initial resistivity $R_{initial}$. In some embodiments, increasing the amount of tungsten in the composition can reduce the operating resistivity $R_{operating}$ and/or reduce a difference between the operating resistivity $R_{operating}$ and the initial resistivity initial resistivity $R_{initial}$.

In some embodiments, the position and/or the thickness of the first and third materials 112, 122 within the first and second electrode structures 110, 120 can be varied to, for example, provide a specific resistivity profile for the first and second electrode structures 110, 120. For example, as described in detail above, in the embodiment illustrated in FIG. 1 the first material 112 has a smaller thickness than the second material and is positioned over the second material 114, and the third material 122 has a smaller thickness than the fourth material 124 and is positioned over the fourth material 124. FIGS. 4-7 are enlarged views of one of the columns 107 of FIG. 1 illustrating different arrangements of the first and second materials 112, 114 in the first electrode structure 110 and/or different arrangements of the third and fourth materials 122, 124 in the second electrode structure 120 in accordance with additional embodiments of the present technology.

Figure 4:
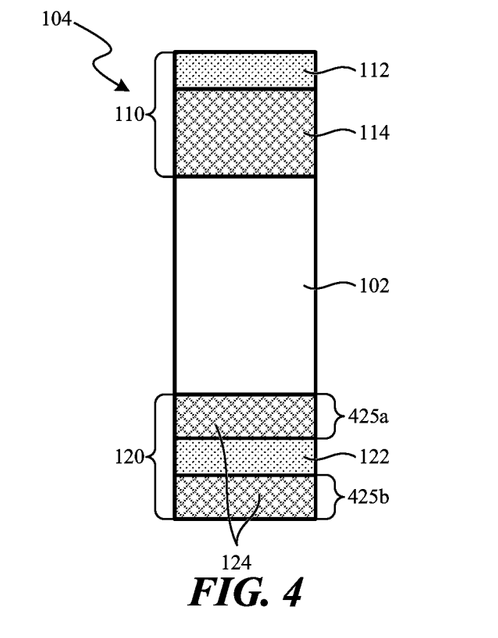
FIGS. 4-7 are enlarged views of a column of the memory device of FIG. 1 including a memory cell, a first electrode structure, and a second electrode structure, and illustrating different arrangements of the first electrode structure and/or the second electrode structure in accordance with additional embodiments of the present technology.

Referring first to FIG. 4, in some embodiments the third material 122 can be positioned between a first layer 425a and a second layer 425b of the fourth material 124. In some embodiments, a volume of the third material 122 and a volume of the fourth material 124 can be equal to or substantially equal to the volumes of the third and fourth materials 122, 124 in the embodiment of FIG. 1. The first electrode structure 110 can be arranged as in the embodiment of FIG. 1.

Figure 5:
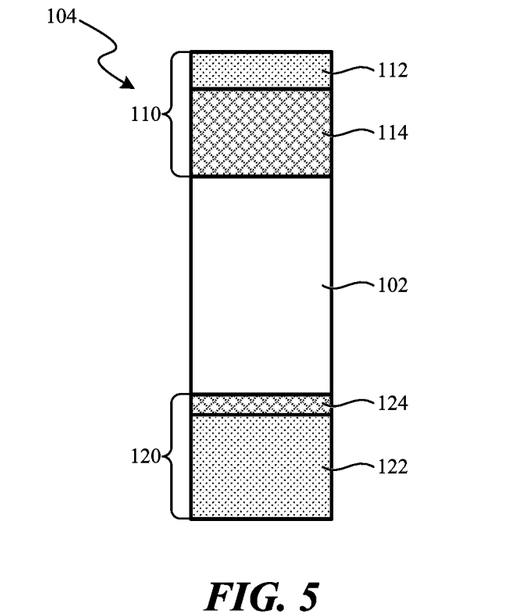

Referring to FIG. 5, in some embodiments a thickness of the third material 122 can be greater than a thickness of the fourth material 124. In some embodiments, a volume of the third material 122 can be greater than a volume of the third material 122 in the embodiment of FIG. 1, and a volume of the fourth material 124 can be smaller than a volume of the fourth material 124 in the embodiment of FIG. 1. That is, for example, the third material 122 can at least partially replace a portion of the fourth material 124. In some embodiments, the fourth material 124 can act as a barrier to inhibit interactions between the third material 122 and the memory element 102, and can have a thickness selected (e.g., just great enough) to achieve this function. The first electrode structure 110 can be arranged as in the embodiment of FIG. 1.

Figure 6:
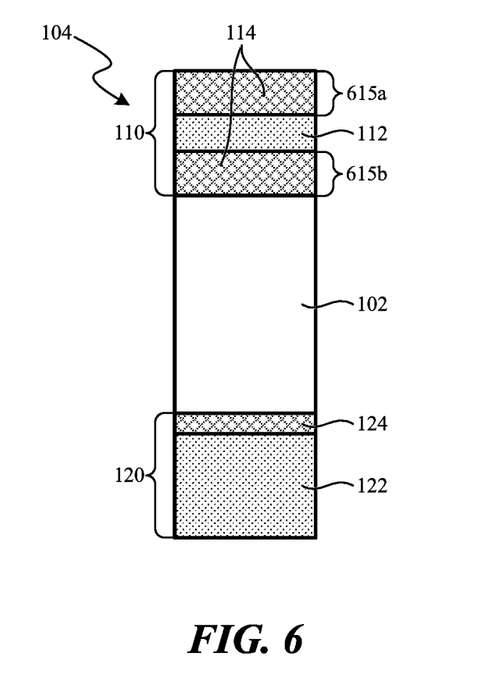

Referring to FIG. 6, in some embodiments the first material 112 can be positioned between a first layer 615a and a second layer 615b of the second material 114. In some embodiments, a volume of the first material 112 and a volume of the second material 114 can be equal to or substantially equal to the volumes of the first and second materials 112, 114 in the embodiment of FIG. 1. The second electrode structure 120 can be arranged as in the embodiment of FIG. 5.

Figure 7:
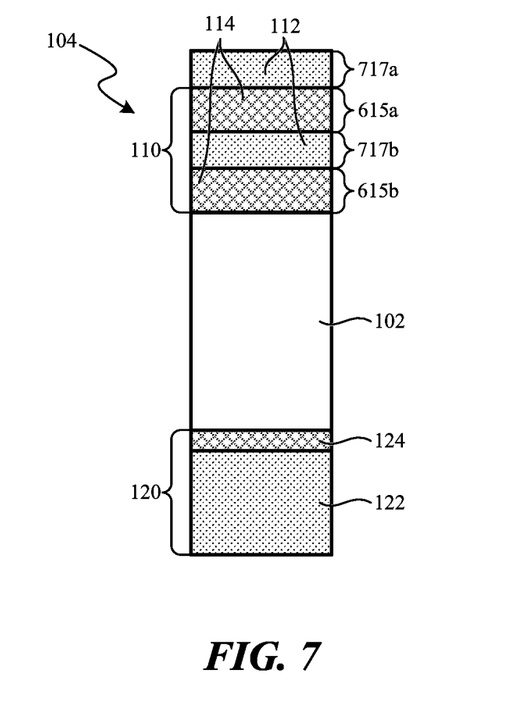

Referring to FIG. 7, in some embodiments the first material 112 can be arranged in a first layer 717a and a second layer 717b relative to the first and second layers 615a-b of the second material 114. That is, the first and second layers 717a-b of the first material can be interleaved between (e.g., alternate with) the first and second layers 615a-b of the second material 114. The second electrode structure 120 can be arranged as in the embodiment of FIG. 5.

Although various arrangements of the first and second electrode structures 110, 120 are shown in FIGS. 4-7, one of ordinary skill in the art will understand that the arrangements can be combined and/or modified. For example, the thicknesses of the various materials can be changed and/or the materials can be arranged in more or fewer layers. Moreover, different ones of the columns 107 in the memory device 100 can have different arrangements of the first electrode structure 110 and/or second electrode structure 120. That is, the columns 107 in the memory device 100 can be the same or different.

The memory devices described herein can be manufactured at the wafer level or at the die level and can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Figure 8:
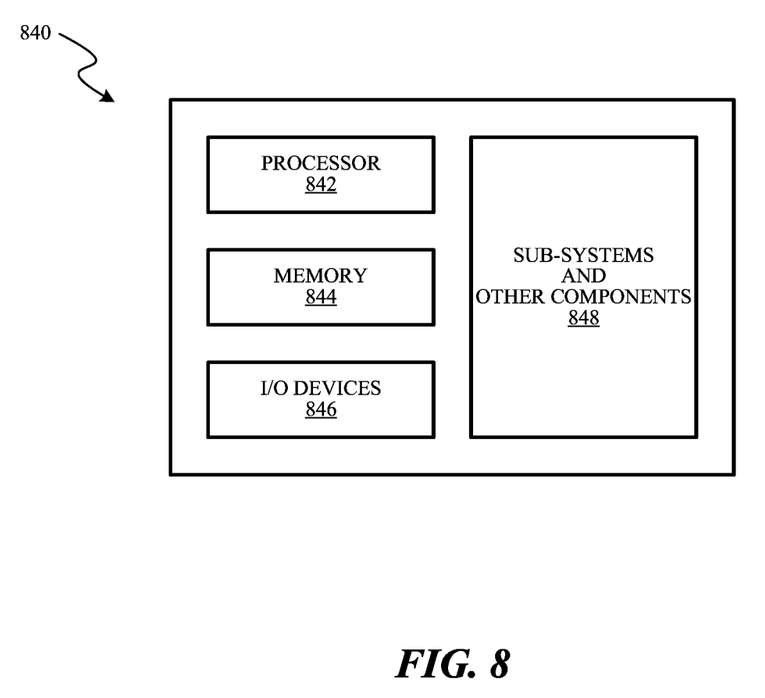
FIG. 8 is a schematic view of a system that includes a memory device in accordance with embodiments of the present technology.

The memory device 100 described in detail above with reference to FIGS. 1-7 and/or packages incorporating the memory device 100 can be incorporated into any of a myriad of larger and/or more complex systems, a representative example of which is system 840 shown schematically in FIG. 8. The system 840 can include a processor 842, a memory 844 (e.g., SRAM, DRAM, NAND, flash, and/or other memory devices), input/output devices 846, and/or other subsystems or components 848. The memory devices and/or packages described above with reference to FIGS. 1-7 can be included in any of the elements shown in FIG. 8. The resulting system 840 can be configured to perform any of a wide variety of suitable computing, processing, storage, sensing, imaging, and/or other functions. Accordingly, representative examples of the system 840 include, without limitation, computers and/or other data processors, such as desktop computers, laptop computers, Internet appliances, hand-held devices (e.g., palm-top computers, wearable computers, cellular or mobile phones, personal digital assistants, music players, and so on), tablets, multi-processor systems, processor-based or programmable consumer electronics, network computers, and minicomputers. Additional representative examples of the system 840 include lights, cameras, vehicles, etc. With regard to these and other example, the system 840 can be housed in a single unit or distributed over multiple interconnected units, for example, through a communication network. The components of the system 840 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A memory device, comprising:
a memory element; and
an electrode structure electrically coupled to the memory element, wherein the electrode structure includes a material comprising a composition of tungsten, silicon, and germanium, wherein the electrode structure is configured to have a first resistivity before being exposed to a plurality of thermal cycles, wherein the electrode structure is configured to have a second resistivity after being exposed to the plurality of thermal cycles, and wherein the second resistivity is greater than the first resistivity.

2. The memory device of claim 1 wherein the material is a first material, and wherein the electrode structure further includes a second material different than the first material.

3. The memory device of claim 2 wherein the second material is between the memory element and the first material.

4. The memory device of claim 2 wherein the second material is a carbon-based material.

5. The memory device of claim 2 wherein the first material has a greater thickness than the second material.

6. The memory device of claim 2 wherein the second material has a greater thickness than the first material.

7. The memory device of claim 2 wherein the thickness of the first material is less than 100 angstroms.

8. The memory device of claim 2 wherein the thickness of the first material is between about 50-90 angstroms.

9. The memory device of claim 2 wherein the thickness of the first material is between about 10-30 angstroms.

10. The memory device of claim 1 wherein a ratio of silicon to tungsten in the composition is greater than or equal to 1.0.

11. The memory device of claim 1 wherein a ratio of germanium to tungsten in the composition is greater than or equal to 1.0.

12. The memory device of claim 1 wherein a ratio of silicon to tungsten is greater than a ratio of germanium to tungsten in the composition.

13. The memory device of claim 1 wherein a ratio of silicon to tungsten is less than a ratio of germanium to tungsten in the composition.

14. A memory device, comprising:
a memory element; and
an electrode structure electrically coupled to the memory element, wherein the electrode structure includes a material comprising a composition of tungsten, silicon, and germanium, wherein the electrode structure is configured to have a first resistivity before being exposed to a plurality of thermal cycles, wherein the electrode structure is configured to have a second resistivity after being exposed to the plurality of thermal cycles, wherein the first resistivity is less than about 0.01 ohm-centimeter, and wherein the second resistivity is greater than the first resistivity.

15. The memory device of claim 14 wherein the electrode structure further includes a carbide material, and wherein the composition of tungsten, silicon, and germanium is formed as a thin film over the carbide material.

16. The memory device of claim 14 wherein the memory element includes a phase-change material.

17. A memory device, comprising:
a memory element;
a first electrode structure electrically coupled to the memory element, wherein the first electrode structure includes a first material comprising a first composition of tungsten, silicon, and germanium, wherein the first electrode structure is configured to have a first resistivity before being exposed to a plurality of thermal cycles, wherein the first electrode structure is configured to have a second resistivity after being exposed to the plurality of thermal cycles, and wherein the second resistivity is greater than the first resistivity; and
a second electrode structure electrically coupled to the memory element, wherein the second electrode structure includes a second material comprising a second composition of tungsten, silicon, and germanium, wherein the second electrode structure is configured to have a third resistivity before being exposed to a plurality of thermal cycles, wherein the second electrode structure is configured to have a fourth resistivity after being exposed to the plurality of thermal cycles, and wherein the fourth resistivity is greater than the third resistivity.

18. The memory device of claim 17 wherein the first electrode structure further includes a third material different than the first material, and wherein the second electrode structure further includes a fourth material different than the second material.

19. The memory device of claim 18 wherein the third material is between the first material and the memory element, and wherein the fourth material is between the second material and the memory element.

20. The memory device of claim 18 wherein the third and fourth materials are different.

21. The memory device of claim 18 wherein the third and fourth materials are carbide materials.

22. The memory device of claim 17 wherein the first and second materials are the same.

* * * * *